US005122676A

United States Patent [19]

Stewart et al.

[11] Patent Number: 5,122,676

[45] Date of Patent: Jun. 16, 1992

[54] VARIABLE PULSE WIDTH GENERATOR INCLUDING A TIMER VERNIER

[75] Inventors: Roger G. Stewart, Neshanic Station; George R. Briggs, Princeton, both of N.J.

[73] Assignee: Thomson, S.A., Courbevoie, France

[21] Appl. No.: 620,681

[22] Filed: Dec. 3, 1990

[51] Int. Cl.[5] ............................................ H03K 3/017

[52] U.S. Cl. ...................................... 307/265; 307/592

[58] Field of Search ............... 307/265, 266, 267, 592, 307/594, 605; 328/58

[56] References Cited

U.S. PATENT DOCUMENTS

| | | | |
|---|---|---|---|
| 3,612,975 | 10/1971 | Keefe | 328/58 |
| 3,840,814 | 10/1974 | Schiffman | 307/265 |
| 4,429,236 | 1/1984 | Nitschke | 307/592 |
| 4,532,435 | 7/1985 | Wood | 307/265 |
| 4,742,346 | 5/1988 | Gillette et al. | 340/793 |
| 4,766,430 | 8/1988 | Gillette et al. | 340/793 |
| 4,959,557 | 9/1990 | Miller | 307/265 |

*Primary Examiner*—Eugene R. LaRoche
*Assistant Examiner*—Amir Zarabian
*Attorney, Agent, or Firm*—J. S. Tripoli; D. H. Irlbeck; L. L. Hallacher

[57] ABSTRACT

A pulse logic circuit comprises a plurality of interconnected stages. Each of the stages includes a relatively large node-charging transistor which, when enabled, forwards charging current to a node from a timing pulse of one of a plurality of phases applied to a load capacitance in series with the node-charging transistor. Such large transistors exhibit significant gate-to-source and gate-to drain distributed capacitances. The response time for charging a selected stage node can be decreased by precharging the gate of the node-charging transistor of a selected stage to enable the transistor prior to the application of a timing pulse, thereby increasing the maximum operating speed of the circuit. Disclosed species of such a pulse logic circuit include time vernier circuits which can be utilized as control circuitry for a liquid crystal television or computer display.

17 Claims, 10 Drawing Sheets

| 109TFT | 1 | 2 | 3 | 4 | 5 | 6 | 7 | 8 |
|---|---|---|---|---|---|---|---|---|
| D1V | X | | X | | | | | |
| $\overline{D1}$V | | | | | X | | X | |
| D2V | | X | | | | X | | |
| $\overline{D2}$V | | | | X | | | | X |

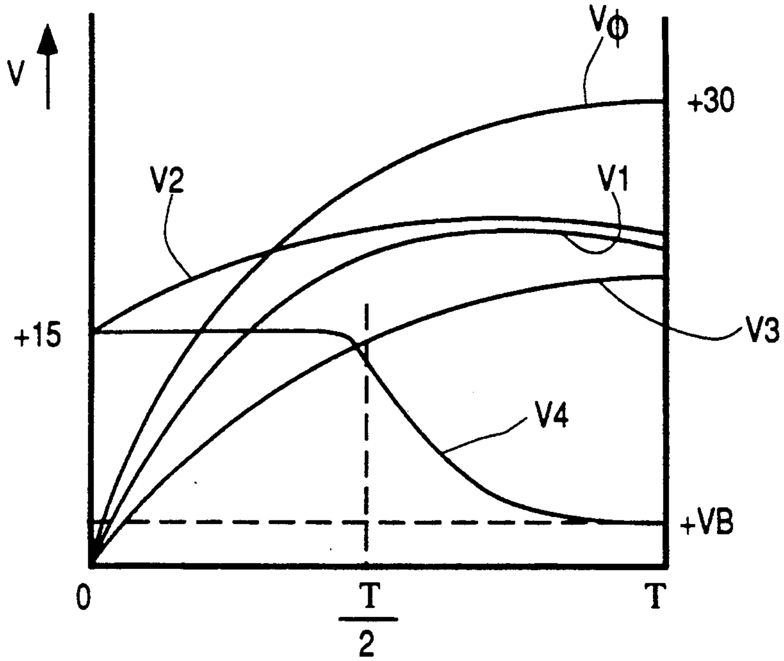
FIG. 7
FIG. 8
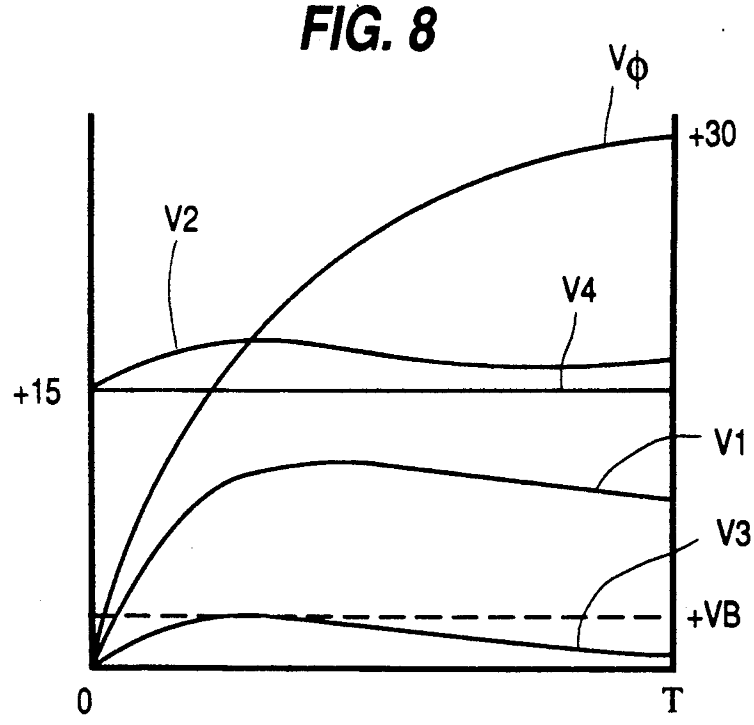

VARIABLE PULSE WIDTH GENERATOR INCLUDING A TIMER VERNIER

BACKGROUND

Liquid-crystal television and computer displays (LCD) are known in the art, for example, reference is made to U.S. Pat. No. 4,766,430, issued to Gillette et al. on Aug. 23, 1988, incorporated herein by reference. As disclosed in this patent, a select-line scanner selects one horizontal scan line at a time of a video signal (having an active portion of about 50 μsec.) and a ramp voltage is applied through respective transfer gates to each vertical data line, thereby charging the liquid crystal pixels arranged at the crosspoints of the vertical data lines and the selected horizontal line. A 6-bit counter associated with each vertical data line, primed in accordance with the level of the particular one of the 64 different possible grey-scale brightness levels of the crosspoint pixel, is decremented to zero, at which point the transfer gate associated with that vertical data line is opened, thereby making the charge on the liquid crystal crosspoint pixel proportional to its proper brightness level. Thus, the counting rate of the 6-bit counter needs to be only about 1.25 MHz, i.e., the reciprocal of 50/64 μsec.

Because amorphous silicon (aSi) is inexpensive compared to polysilicon, it is desirable to employ aSi for a television LCD on a chip, which also includes the control circuitry therefor. Due to the relatively large capacitive time constant of control-circuitry comprised of aSi transistors, it is not normally possible to operate a data-line counter at a rate substantially higher than the 1.25 MHz rate of the 6-bit counter disclosed in the aforesaid Gillette et al. patent. However, an effective rate of about 5 MHz is required to accommodate the 256 (8-bit) grey-scale level employed by NTSC television. In addition, the capacitance of each select line of the LCD, which constitutes the load of each stage of the select-line scanner, is quite large and requires a relatively high-power transistor to completely charge the select line during the relatively short (no more than about 13 μsec.) non-active portion of each horizontal-line video signal. Again, the relatively slow operation of aSi transistors normally prevents such transistors from being employed in the select-line scanner of a relatively high-resolution LCD (e.g., a television display comprised of about 250,000 pixels per frame).

SUMMARY

The present invention is directed to pulse logic circuits which overcome one or more of the problems discussed above. While these pulse logic circuits differ in detail from one another, they all comprise P ordinally-arranged interconnected bootstrapped stages (where P is a plural integer), each stage including a node-charging transistor having a capacitance load in series therewith for forwarding charging current of a timing pulse applied to the capacitance load to a node by conduction of said node-charging transistor when the node-charging transistor of that stage is enabled. Further, the node-charging transistor of each stage exhibits significant distributed capacitances between its gate and its source and between its gate and its drain. First means selectively applies a precharging pulse to the gate of the node-charging transistor of at least one selected stage prior to the application of the timing pulse to the capacitive load of the selected stage, thereby enabling the node-charging transistor of the selected stage when its gate remains precharged. The first means also maintains the node-charging transistor of each non-selected one of the stages disabled. Second means (1) applies first timing pulses that occur at a first one of a predetermined plurality of different phases to the load capacitance of one or more certain stages of the interconnected stages and (2) applies second timing pulses that occur at a second one of the predetermined plurality of different phases to the load capacitance of one or more stages of the interconnected stages other than the certain stages. The precharging of the gate of an enabled node-charging transistor decreases its response time to an applied timing pulse and thereby increases the maximum speed at which the pulse logic circuit may be operated, despite the significant respective distributed capacitances that exist between the gate and the source and between the gate and the drain of the node-charging transistor of each stage.

CROSS REFERENCE TO RELATED APPLICATIONS

Application Ser. No. 620,683 filed concurrently herewith by George R. Briggs. entitled "Apparatus For Generating Control Pulses Of Variable Width, As For Driving Display Devices" describes circuitry which can be used with the present invention. The disclosure of this application is incorporated herein by reference.

BRIEF DESCRIPTION OF THE DRAWINGS

FIG. 7 shows the voltages as a function of time at different points of the equivalent circuit of FIG. 5 under first operating conditions;

FIG. 8 shows the voltages as a function of time at different points of the equivalent circuit of FIG. 5 under second operating conditions;

DETAILED DESCRIPTION

Figure 1:
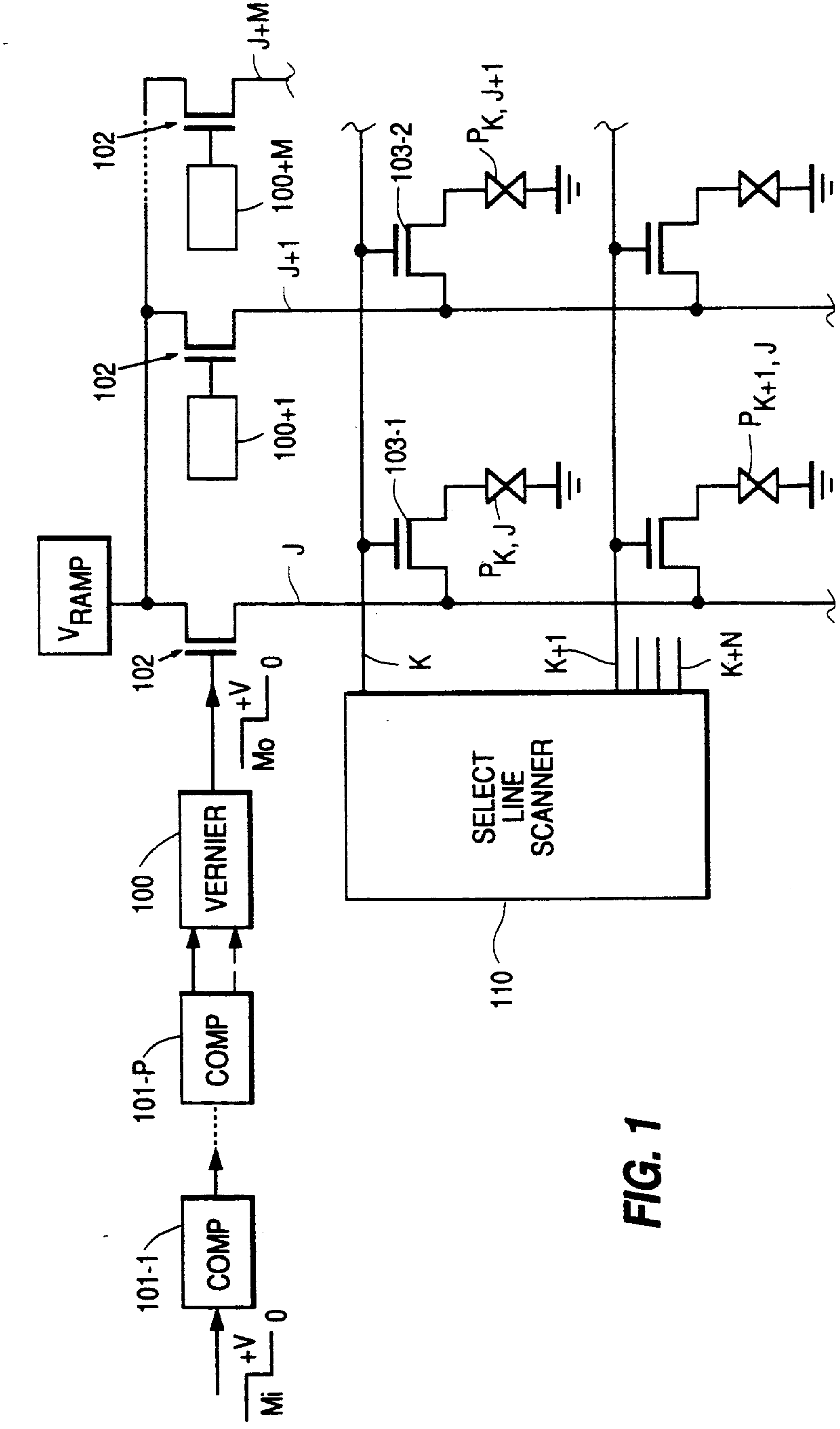
FIG. 1 shows a system, including a time vernier circuit, responsive to grey-scale digital data for controlling the time of terminating the application of a ramp-waveform charging voltage to one data line of an LCD display, comprised of M data lines and N select lines, in accordance with the applied grey-scale digital data.

In FIG. 1, a time vernier circuit 100, receives control inputs from cascaded comparator, or counter, circuits 101-1 to 101-P and provides an output pulse Mo that is individually associated through pixel drive line transistor 102 with data line J of an LCD comprised of M data lines and N select lines. Additional time vernier circuits, similar to time vernier circuit 100, are individually associated, through other pixel drive line transistors 102, with each of the data lines J to J+M. The comparators 101-1 to 101-P receive the data bits and provide an output pulse having a width determined by the most significant bits (MSB's). The two least significant bits (LSB) are applied to vernier circuit 100, which divides the last period into any one of four intervals. A ramp waveform charging voltage ($V_{Ramp}$), shown in FIG. 2, is applied to the respective drains of the pixel drive line transistors 102 associated with all the data lines J.

Liquid-crystal pixels P (e.g., $P_{k,j}$ and $P_{k+1,j}$), which are capacitances, are located at the crosspoints of each select line and each data line. A select line scanner (shown in the above cited Gillette et al. patent) renders conducting all of the select-line transistors 103 which are associated with the select lines (e.g. transistors 103-1 and 103-2 associated with select line K). This permits $V_{Ramp}$ to charge all pixels P (e.g., $P_{k,j}$ and $P_{k,j+1}$) associated with a conductive pixel drive line transistor 102 and the activated select line K.

Figures 2, 4:
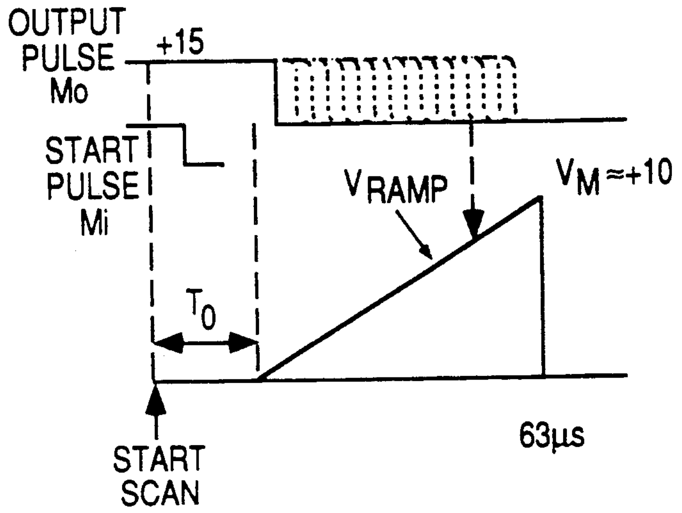
FIG. 2 shows the output pulse of the vernier of FIG. 1 and the ramp-waveform charging voltage during each 63 μsec. scan line.
FIG. 4 shows the data inputs to the four stages of the FIG. 3 embodiment.

In FIG. 2, $V_{Ramp}$ occupies the active portion of each 63 μsec. horizontal scan period of the video signal. During the inactive portion, from the start of the horizontal scan to the beginning of the active portion, the select line scanner switches from one select line to the next, such as by switching from line K to line K+1. At the beginning of the active portion, the level of $V_{Ramp}$ is zero and at the end of the active portion the level of $V_{Ramp}$ reaches its maximum value $V_M$. A liquid-crystal pixel charged to $V_M$ is charged to the maximum brightness and other pixels are charged to various levels determined by the data inputs to the comparator circuits 101-1 to 101-P and vernier circuit 100. In order to accurately provide a liquid-crystal pixel brightness level in accordance with a given grey-scale digital value, it is necessary to turn off pixel drive line transistor 102 at the correct instant in the horizontal scan active portion, to prevent $V_{Ramp}$ from either undercharging or overcharging the liquid-crystal pixel, and result in an improper brightness level. FIG. 2 also shows how the number of possible widths of the output pulse Mo can be changed by the comparator circuits 101-1 to 101-P and vernier circuit 100. The number of possible pulse widths is determined by the particular embodiments of the comparator 101 of the vernier circuit 100 employed, as explained hereinafter.

In FIG. 1, each pixel drive line transistor 102 must charge a complete data line, which has high capacitance, and therefor a high power transistor is needed. Because of the high power requirement, pixel drive line transistor 102, which preferably is a field-effect transistor (FET) of the thin film type (TFT), requires a relatively wide channel connecting its source and drain, which increases the respective gate/source and gate/drain capacitances. Because aSi high-power TFT's require wider channels than polysilicon TFT's in order to pass sufficient current, they exhibit particularly large capacitances. The energy stored in such capacitances therefore increases the turn-off response time of such TFT's. Further, as the number of digital grey-scale levels becomes greater (e.g., 256 levels), the needed turn-off response time for pixel drive line transistor 102 becomes shorter. The incorporation of the present invention in time vernier circuit 100 makes it possible to turn off pixel line drive transistor 102 sufficiently quickly for liquid crystal display operation, even when both the pixel drive line transistor 102 and the transistors employed by time vernier circuit 100 are all comprised of low mobility material, such as aSi.

Figure 3:
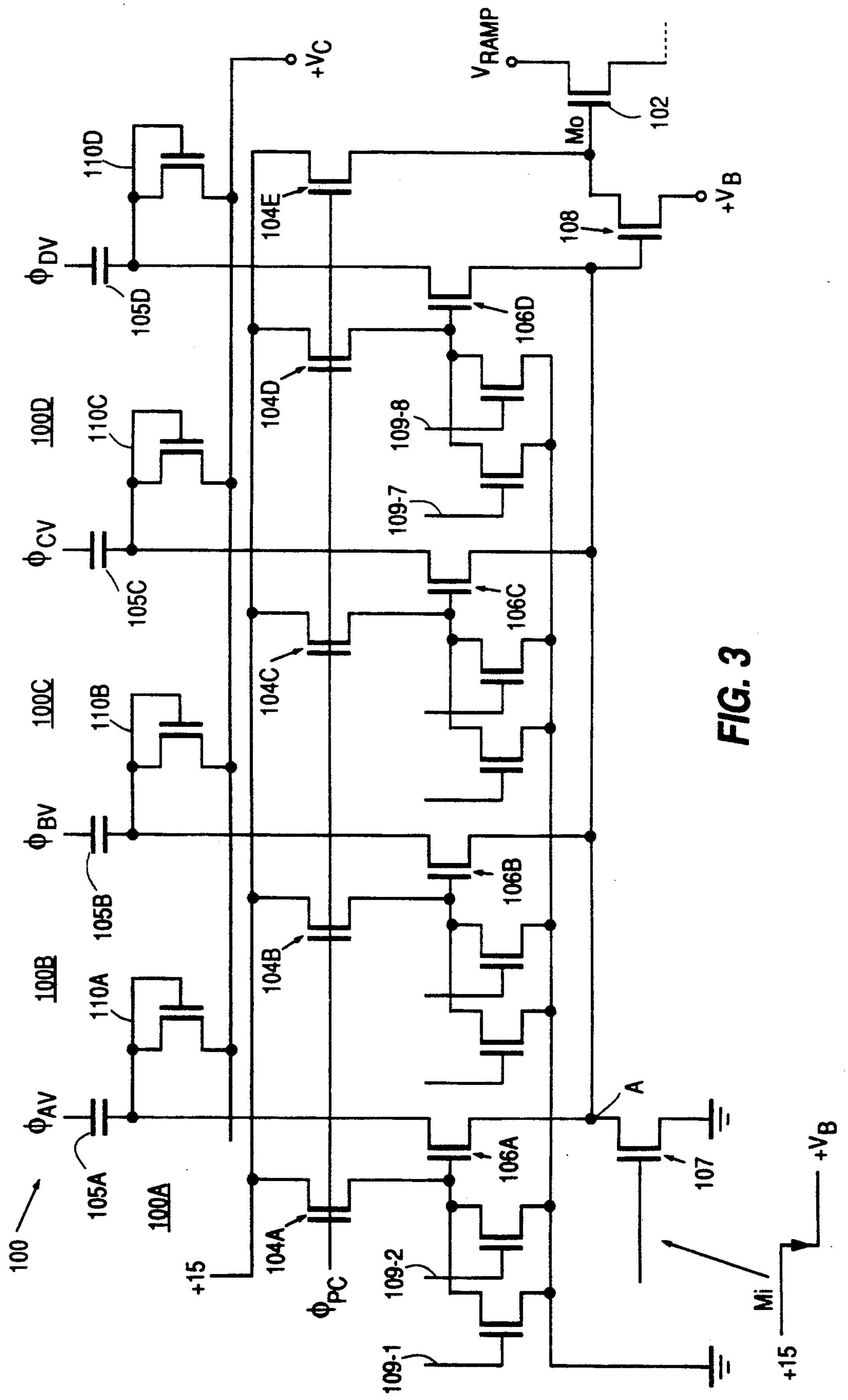
FIG. 3 is a schematic diagram of a single input embodiment of the time vernier circuit of FIG. 1, comprised of four differently-phased stages.

FIG. 3 shows a time vernier circuit 100 for turning off pixel drive line transistor 102 at an instant of time determined by the control inputs applied thereto. These control inputs include a precharging voltage pulse $\phi_{PC}$, which is simultaneously applied to the gates of TFT's 104-A to 104-E, and binary data inputs D1V, D1V, D2V and D2V, which are applied to time vernier circuit 100 during the inactive portion of each horizontal line scan. The control inputs further include an arming pulse Mi, which is the output pulse Mo of the 101-P comparator circuit. Four phase timing pulses $\phi_{AV}$, $\phi_{BV}$, $\phi_{CV}$, $\phi_{DV}$ are applied through capacitors 105A to 105D, respectively to the drains of TFT's 106A to 106D.

The arming pulse Mi is applied to the gate of arming TFT 107, the drain of which is connected to Node A and the source of which is grounded. Node A is also connected to the gate of a pull down TFT 108, the source/drain conduction path of which provides the output pulse Mo to the gate of drive line TFT 102. The source/drain conduction paths of pairs of TFT's 109-1 and 109-2 through 109-7 and 109-8 are respectively connected between the sources of TFT's 104A to 104D and to ground. Clamping TFT's 110A to 110D are associated with each capacitor 105A to 105D to prevent the capacitors from charging above a voltage $+V_c$. The source of TFT 108 is biased with a small positive voltage +VB (e.g. +2 volts), which can be useful in preventing the TFT from responding to spurious voltages on its gate.

For illustration purposes, it is assumed that the preceding comparator stages 101-1 to 101-P provide an output pulse having a width determined by the six most significant bits (MSB) of an 8-bit (i.e. 256 level) gray scale code. Therefore, the time duration of the output Mo pulse can be anyone of 64 possible widths. The purpose of time vernier circuit 100 is to utilize either one or two of the least significant bits (LSB) to expand the possible pulse widths to 256.

Figure 6:
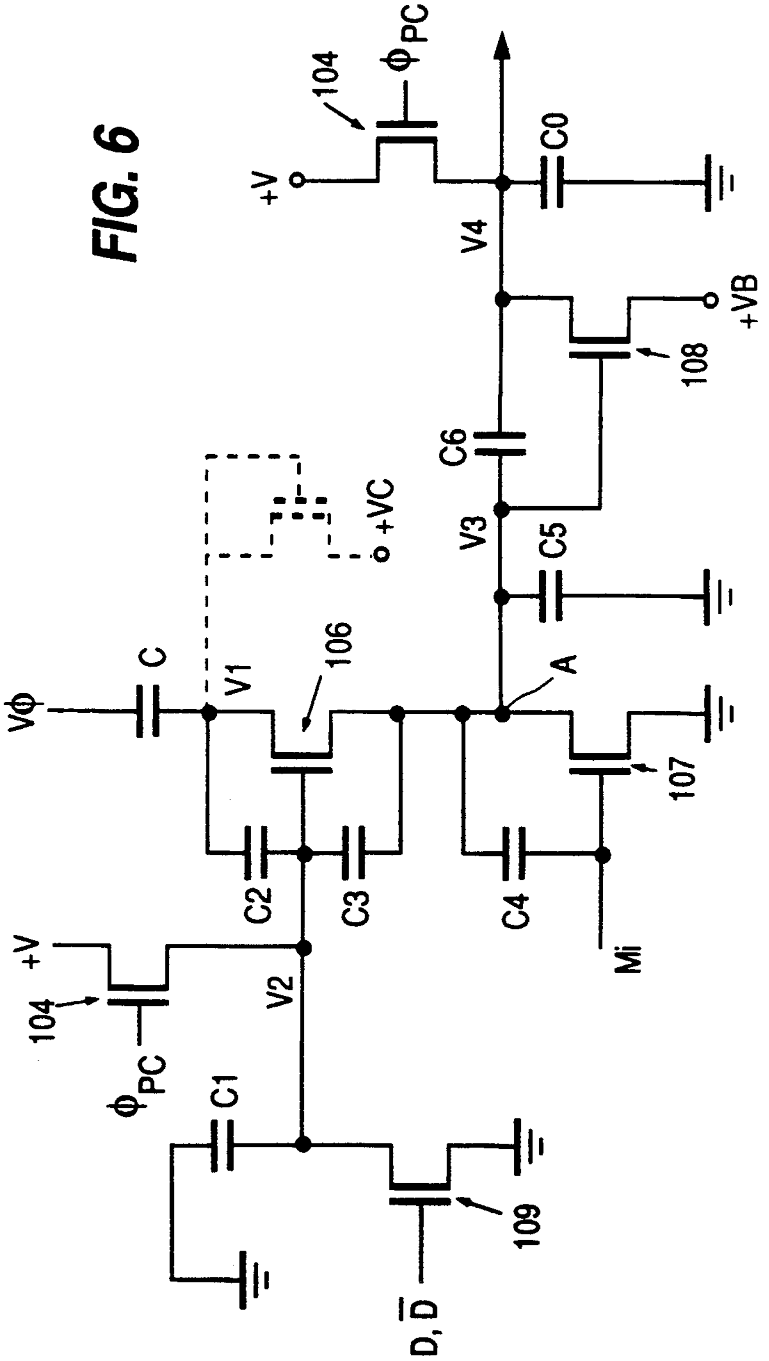
FIG. 6 is an equivalent circuit of a portion of the time vernier circuit of FIG. 1.

Whether one or two of the LSB is utilized in the time vernier 100 is determined by the configuration of the comparators 101-1 to 101-P. The cross-referenced application Ser. No. (RCA 85,678) in FIG. 4 shows a comparator which provides a single output pulse Mo (Mi input to the vernier). With this type of comparator only one LSB is used by the vernier circuit 100, and the MSB data pulse (D1V) of the vernier pulses is provided by regenerating the least significant pulse of the comparator data signal. This is the type of operation is utilized by comparator 100 of FIG. 3. FIG. 6 of the cross-referenced application Ser. No. 620,683 shows a comparator which provides two output pulses $M_{o1}$ and $M_{o2}$, a so called split bus comparator. The time verniers for this type of comparator utilize two LSB's and embodiments are described herein with respect to FIGS. 9 and 13.

FIG. 4 shows the combinations of D1V, D1V, D2V, and D2V pulses which are applied to the gates of TFT's 109-1 to 109-8 of FIG. 3 (x indicates a logic 1). The D1V, and D1V pulses are the same as the LSB data pulses supplied to the comparator stage 101-P (FIG. 1). The D2V and D2V pulses are the data pulses for the vernier circuit 100.

In FIG. 3, the vernier circuit 100 includes four interconnected identical stages 100-A, 100-B, 100-C, and 100-D. Stage 100-A is comprised of thin film transistor 106-A having (1) its gate connected to the junction of the drains of TFT's 109-1 and 109-2 and the source of TFT 104-A; (2) its drain connected to load capacitance 105-A, and (3) its source connected to node A. The similarly numbered elements of stages 100-B, 100-C and 100-D are interconnected in the same manner as described above for the corresponding elements of stage 100-A. Further, the drains of all of transistors 104-A to 104-D are all connected to a point of operating potential (e.g.. +15 volts) and the sources of all of transistors 109-1 to 109-8 are grounded. The precharging voltage pulse $\phi_{PC}$ is applied to the gates of all transistors 104A to 104E. The combinations of data inputs D1V, D1V, D2V, D2V applied to the gates of transistors 109-1 to 109-8 determine the final width of the Mov output pulse, as shown in FIG. 4.

All of the TFT's of FIG. 3 are assumed to be n-type transistors. Further all transistors 104 and 109 of all four stages 100-A to 100-D are small, low-power transistors having channel widths of only about 10–15 micrometers ($\mu$m); the transistor 106 of each stage is a larger, higher power transistor having a channel width of about 100 $\mu$m; transistors 107 and 108 of each stage are still larger, higher power transistors having channel widths of about 200 $\mu$m; and the pixel line drive transistor 102 is a much larger, higher power transistor having a channel width of about 750 $\mu$m.

The larger a transistor is, the larger are the respective distributed capacitances between the gate/source and between the gate/drain junctions, and the more energy the transistor stores. For this reason, a larger, higher power transistor tends to have a relatively slow turn-off or turn-on response time compared to a smaller, lower power transistor. FIG. 6 shows the equivalent circuit for the stages 100A to 100D of FIG. 3. Distributed capacitance $C_1$ is significantly smaller than distributed capacitance $C_2$ and $C_3$; distributed capacitances $C_2$ and $C_3$ are significantly smaller than distributed capacitances $C_4$, $C_5$ and $C_6$; and distributed capacitances $C_4$, $C_5$ and $C_6$ are significantly smaller than distributed capacitance $C_0$.

Figure 5:
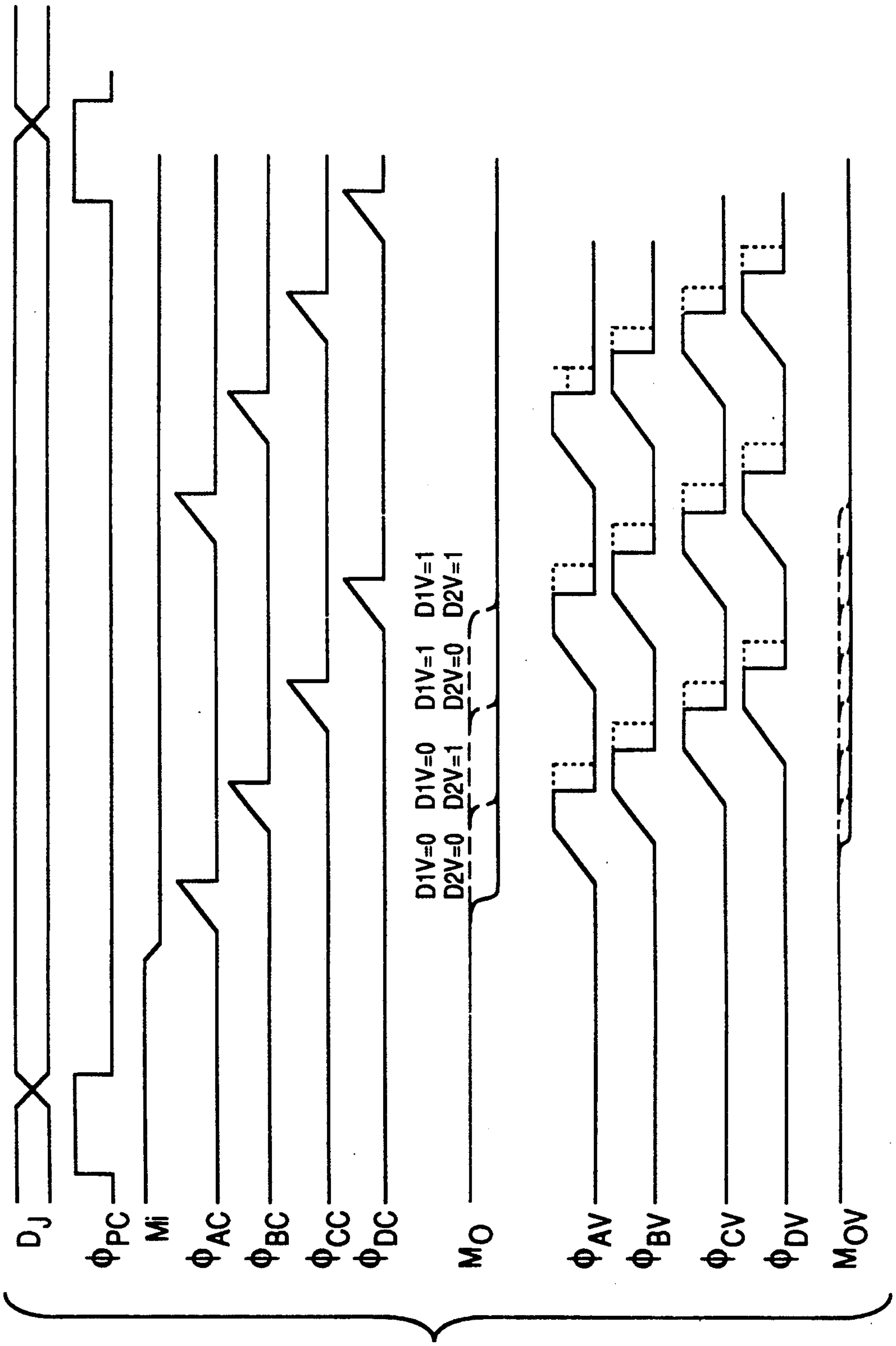
FIG. 5 is a timing diagram of the vernier and final comparator stage of the embodiment of FIG. 1.

The operation of the time vernier circuit 100 of FIG. 3 is described with the aid of the FIG. 2, the timing diagram of FIG. 5, the FIG. 6 equivalent circuit, and the FIGS. 7 and 8 voltage vs. time diagrams. The Mi arming pulse remains high (+15 volts) from about the beginning of each 63 $\mu$sec. horizontal scan line until the occurrence of the time selected by the 2 LSB's of the 8-bit grey scale for turning off pixel drive line transistor 102. When the arming pulse Mi is high, transistor 107 is enabled. During the inactive portion of the horizontal scan line, both the precharging voltage pulse $\phi_{PC}$ and the data inputs D1V, D1V, D2V, and D2V are applied. With transistor 107 enabled, node A and the gate of the 108 transistor are clamped to ground, thereby disabling transistor 108. Therefore, the precharging voltage pulse $\phi_{PC}$ applied to the gate of TFT 104 enables the transistor, and the gate of pixel drive line transistor 102 is charged to +15 volts, to render pixel drive line transistor 102 conductive. The $V_{Ramp}$ voltage is then applied to the associated pixel of the LCD. Also, each of the 109 transistors receiving a logic ONE D1V, D1V, D2V, D2V pulse on its gate is rendered conducting during the application of the precharging voltage pulse $\phi_{PC}$ to the gate of the 104 TFT, thereby clamping the gate of its 106 transistor to ground and disabling the 106 transistor. Although the logical ONE data inputs are short, low-power pulses, they can completely turn on the 109 transistors and permit any residual charge that may be present on the gate of the 106 transistor to be quickly discharged to ground. This is true because the 109 transistors are small.

In FIG. 3, the 109 transistor of any stage which has a logical ZERO data input applied to its gate remains non-conducting. Therefore, the 104 transistor of any stage having both 109 transistor non-conducting, when enabled by the precharging voltage pulse $\phi_{PC}$, charges the gate of its 106 transistor to +15 volts, thereby enabling the transistor. However, at this time no voltage is applied to the drain of the enabled 106 transistor and the transistor remains non-conducting until the occurrence of the timing pulse $\phi_A$, $\phi_B$, $\phi_C$, or $\phi_D$ associated with the enabled stage is applied to the drain of the TFT 106 through the load capacitance 105.

The data inputs D1V, D1V, D2V, and D2V and the precharging voltage pulse $\phi_{PC}$ all terminate prior to the beginning of the active potion of a horizontal scan line. This leaves the respective gates of the 106 transistors of all four stages and the pixel drive line transistor 102 floating. Therefore the 106 transistor gates of the stages that are associated with logical ONE data inputs remain at ground potential, maintaining these 106 transistors disabled. The 106 transistor gate of any stage associated with two logical ZERO data inputs and the gate of the pixel drive line transistor 102 remain at a potential of +15 volts, maintaining the 106 transistor enabled and the pixel drive line transistor 102 conducting. Further, as long as the potential of the start gate remains at +15 volts, conducting transistor 107 maintains node A and the gate of transistor 108 clamped to ground, thereby permitting the pixel drive line transistor 102 to remain conducting and continue to transfer the $V_{Ramp}$ to the associated pixel of the LCD.

The Mi arming pulse drops from a potential of +15 volts to +VB volts at a time determined by the six highest bits of the 8-bit grey scale. For the FIG. 3 embodiment the LSB of the comparator data bits and the vernier data bits determine which of the four data inputs D1V, D1V, D2V and D2V are a logic ZERO. Thus, as shown in FIG. 5, the two DV signals which are logic ZERO determine when the Mo output pulse of vernier circuit 100 drops and turns on TFT 102 to cease the application of $V_{Ramp}$ to the associated pixel of the LCD.

In FIG. 5, the relative timing of the vernier control signals to vernier 100 are shown. The $\phi_{AC}$ to $\phi_{DC}$ pulses are the clock pulses of the last comparator stage 101-P (FIG. 1). The $\phi_{AV}$ to $\phi_{DV}$ pulses are the clock pulses to the vernier stage 100. The D1V, and D1V D2V, D2V signals are applied to stages 100A to 100D and only one of the four stages receives two logic ZERO signals to control the Mo output signal. The $\phi_{AV}$ to $\phi_{DV}$ clock pulses have ramp rises and the Mo output of vernier 100 goes low near the middle of the ramp. The application of the D1V, D1V, D2V and D2V signals to the gates of TFT's 109-1 to 109-8 is shown in FIG. 4. As shown in FIG. 5, the use of eight TFT's 109-1 to 10-9-8 enables the vernier and last comparator stage to provide eight time segments for the Mov output.

It is essential (1) that there not be a fractional conduction of transistor 108, and (2) that the delay between the occurrence of the arming pulse Mi and the timing pulse $\phi_{Av}$ be minimized in order to ensure that the pixel drive line transistor 102 is turned off at the right time (i.e., at the right grey-scale level of the $V_{Ramp}$). This is accomplished by employing a series of periodic timing pulses for each of the four phases having a period of only one-half that of the given-length time interval, and by employing the particular relationship between the time of the Mi start-gate drop, the four digital inputs, and the $\phi_{pc}$ pulse shown in FIG. 5.

FIG. 7 identifies voltages $V_\phi$(the timing pulses), $V_1$, $V_2$, $V_3$, and $V_4$ that exist at various points of the equivalent circuit of FIG. 6. In FIG. 7, the respective instantaneous values of these voltages are shown during the time T, where T is the duration of a timing pulse (as shown in FIG. 5), assuming that the arming pulse Mi potential is low (i.e., +VB volts). FIG. 8 shows respective instantaneous values of these voltages during the time T, assuming that the arming pulse Mi potential is high (i.e., +15 volts). In those cases in which the grey-scale brightness of a selected LCD pixel is close to its maximum value $V_M$, The start gate potential Mi remains high for a relatively long time, permitting numerous disturbances in the value of $V_3$ (which can be numerous in a fine-intensity step scale design). These disturbances normally tend to partially discharge $V_4$. However, for a 2 volt threshold for TFT 108, by employing a positive bias +VB of about 2 volts, a disturb of $V_3$ of as much as 3 volts can maintain 1 volt below threshold. This can maintain TFT essentially nonconductive. Negligible discharging of voltage $V_4$ therefore may be caused by the 108 transistor in the maximum 50 μsec. active portion of a scan line, as shown by experimental threshold and leakage data.

In FIG. 6, for the 106 transistors of each of the three stages having a logical ONE applied to one of the 109 transistors, it is important that the channels of these transistors remain "off" during the $V_\phi$ excursion. This requires that the small 109 transistors be sufficiently large; or the $C_2$ capacitance be sufficiently small; or the $C_1$ and $C_3$ capacitances be sufficiently large. In practice, for a 106 transistor having a channel width of 100 μm, capable of being switched in a time of 0.7 μsec., a channel width in the range of only 10 to 15 μm. is sufficient for the 104 and 109 transistors. Further, it helps to increase the value of the $C_3$ capacitance relative to that of $C_2$ capacitance (by increasing gate-to-source overlap capacitance) to hold each of the 106 transistors of the three "unselected" stages in the "off" condition.

Another advantage of employing a series of periodic timing pulses for each of the four phases having a period of only one-half that of the given-length time interval is that it permits the duration of each timing pulse to be stretched (see the dashed boxes in FIG. 5) longer than time T. This stretching of the duration of the timing pulses out to the dashed limits is possible without the danger of a "weak trigger" or a "false trigger." This permits the 108 transistor (i.e., one having a channel width of about 200 μm) to be smaller relative to the size of pixel line drive transistor 102 (i.e., one having a channel width of about 750 μm) because the 108 transistor now has more time to complete the discharge of the gate capacitance of pixel line drive transistor 102.

Figure 9:
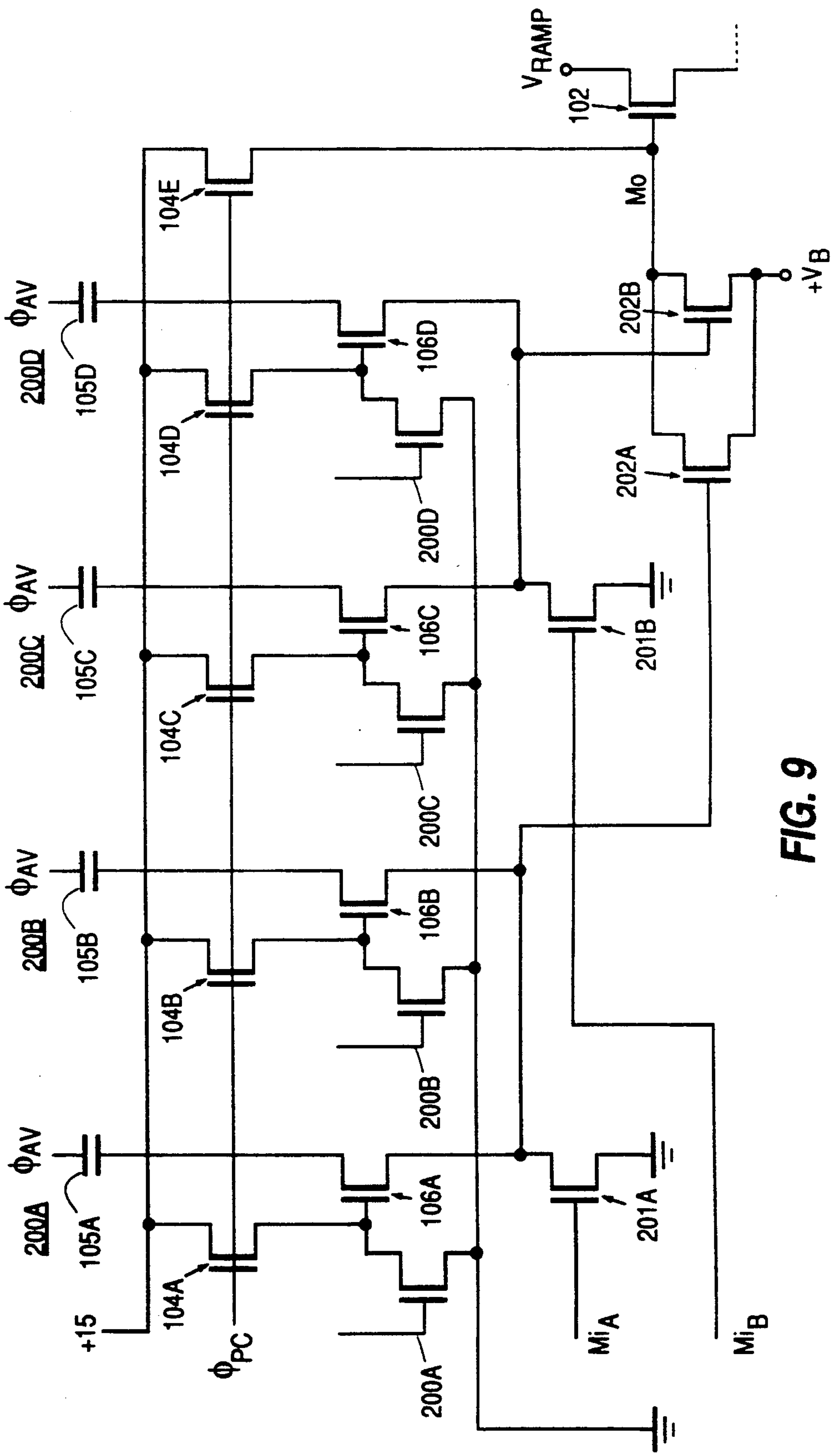
FIG. 9 is a schematic diagram of a two input embodiment of the time vernier circuit of FIG. 1, comprised of four differently-phased stages.
Figure 10:
FIG. 10 shows the data inputs to the four stages of the FIG. 9 embodiment.

FIG. 9 shows an embodiment which utilizes only one LSB and which receives two arming pulses MiA and MiB. This embodiment thus is useful with the split bus type of comparator described in FIG. 5 of the referenced application Serial No. (RCA 85,678). The FIG. 9 embodiment includes four stages 200A to 200D, which as indicated by like reference numbers for like elements, are very similar to stages 100A to 100D of FIG. 3. There are three major differences between the FIG. 9 and FIG. 3 embodiments: (1) the parallel pairs of 109 transistors of FIG. 3 are replaced by single transistors 200A to 200D in each stage, (2) the FIG. 9 embodiment utilizes two arming transistors 201A and 201B, which respectively receive arming pulses MiA and MiB; and (3) there are two pull-down transistors 202A and 202B, either of which pulls down the Mo output signal when turned on. The MiA arming pulse is applied only to phases $\phi_{AV}$ and $\phi_{BV}$, and the MiB arming pulse is applied to phases $\phi_{CV}$ and $\phi_{DV}$. FIG. 10 shows the application of the D1V and D1V data signals to the gates of the 200 transistors. When D1V is high and MiA is low, either phase $\phi_{AV}$ or $\phi_{BV}$ can turn transistor 102 off; similarly, when D1V is high and MiB is low either $\phi_{CV}$ or $\phi_{DV}$ can turn transistor 102 off. Accordingly, with the FIG. 9 embodiment eight pulse widths are possible for the Mo output pulse.

Figure 12:
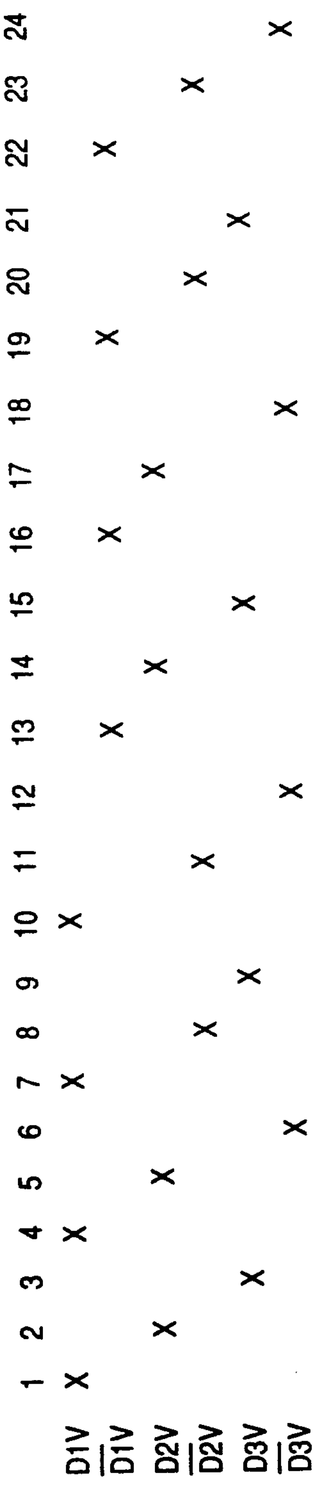
FIG. 12 shows the data inputs applied to the eight stages of the embodiment of the time vernier circuit shown in FIG. 9.
Figure 11:
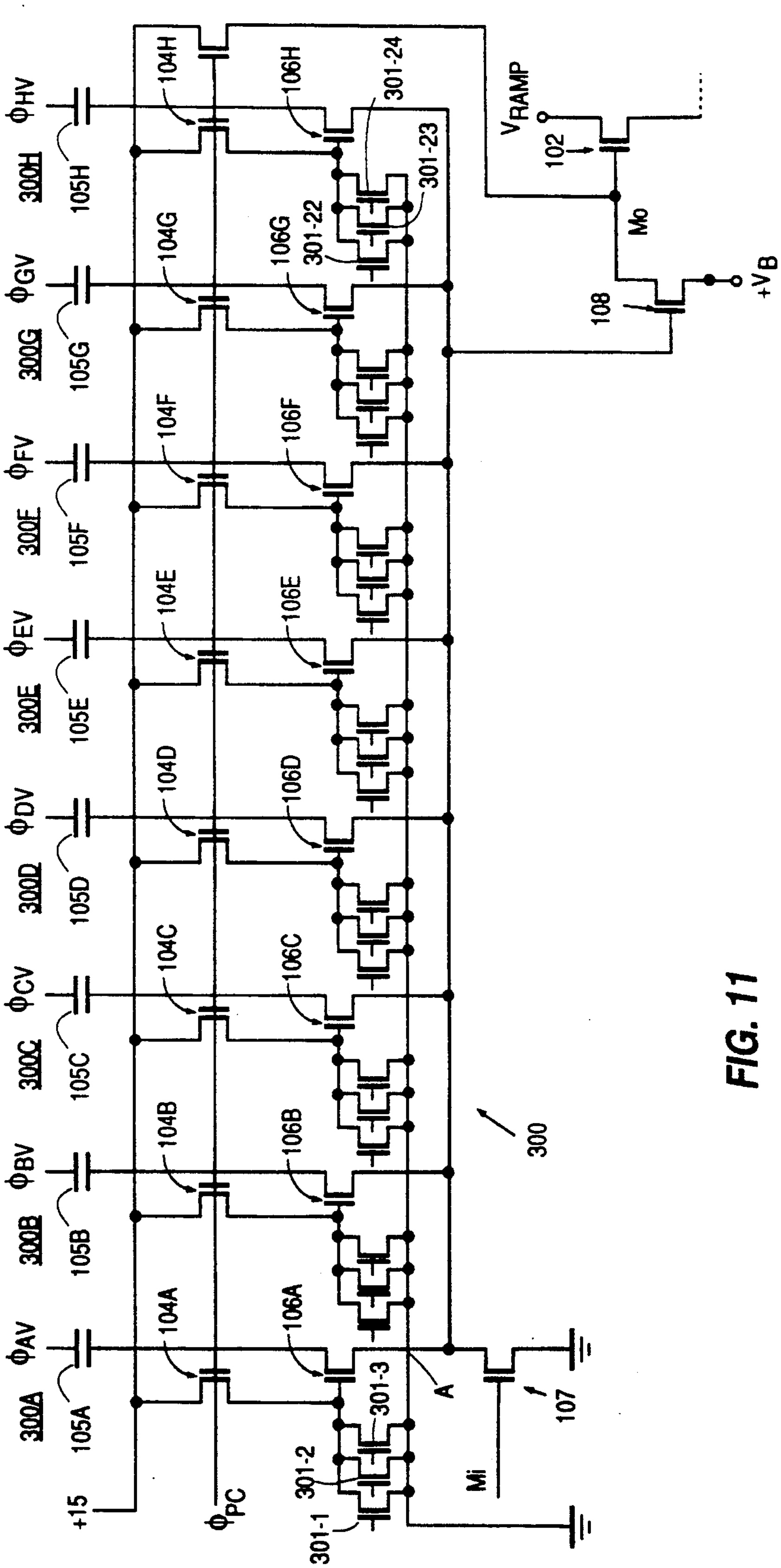
FIG. 11 is a schematic diagram of a single input embodiment of the time vernier circuit of FIG. 1, comprised of eight differently-phased stages.

FIG. 11 is an embodiment of a vernier circuit 300 which receives one arming pulse Mi, and thus is useful with the embodiment of the comparator described in application S/N (RCA 85,678) which provides only one Mi arming pulse to the vernier. The FIG. 11 vernier embodiment includes eight stages 300A to 300H. Each of the stages 300 is identical to the stages 100 of the FIG. 3 embodiment, as indicated by like reference numbers. However, each of the stages 300 includes three parallel transistors 301 which clamp node A to ground when turned on by a control signal. The D1V, D1V,D2V, D2V, D3V and D3V are applied to the vernier as shown in FIG. 12. The D1V signal and its compliment D1V are received from the comparator stage, the same as the FIG. 3 embodiment. The D2V, D3V signals, and their compliments are the two vernier bits. The FIG. 11 timing follows the timing of FIG. 5 but there are eight vernier clock pulses $\phi_A$ to $\phi_H$. The Mo output pulses of the vernier can thus have anyone of 16 possible pulse widths.

Figure 14:
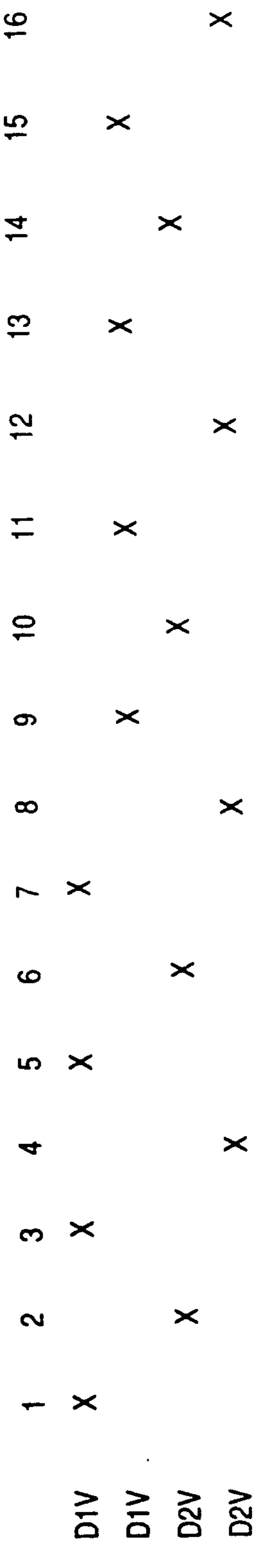
FIG. 14 shows the data inputs applied to each of the eight stages of embodiment shown in FIG. 13.
Figure 13:
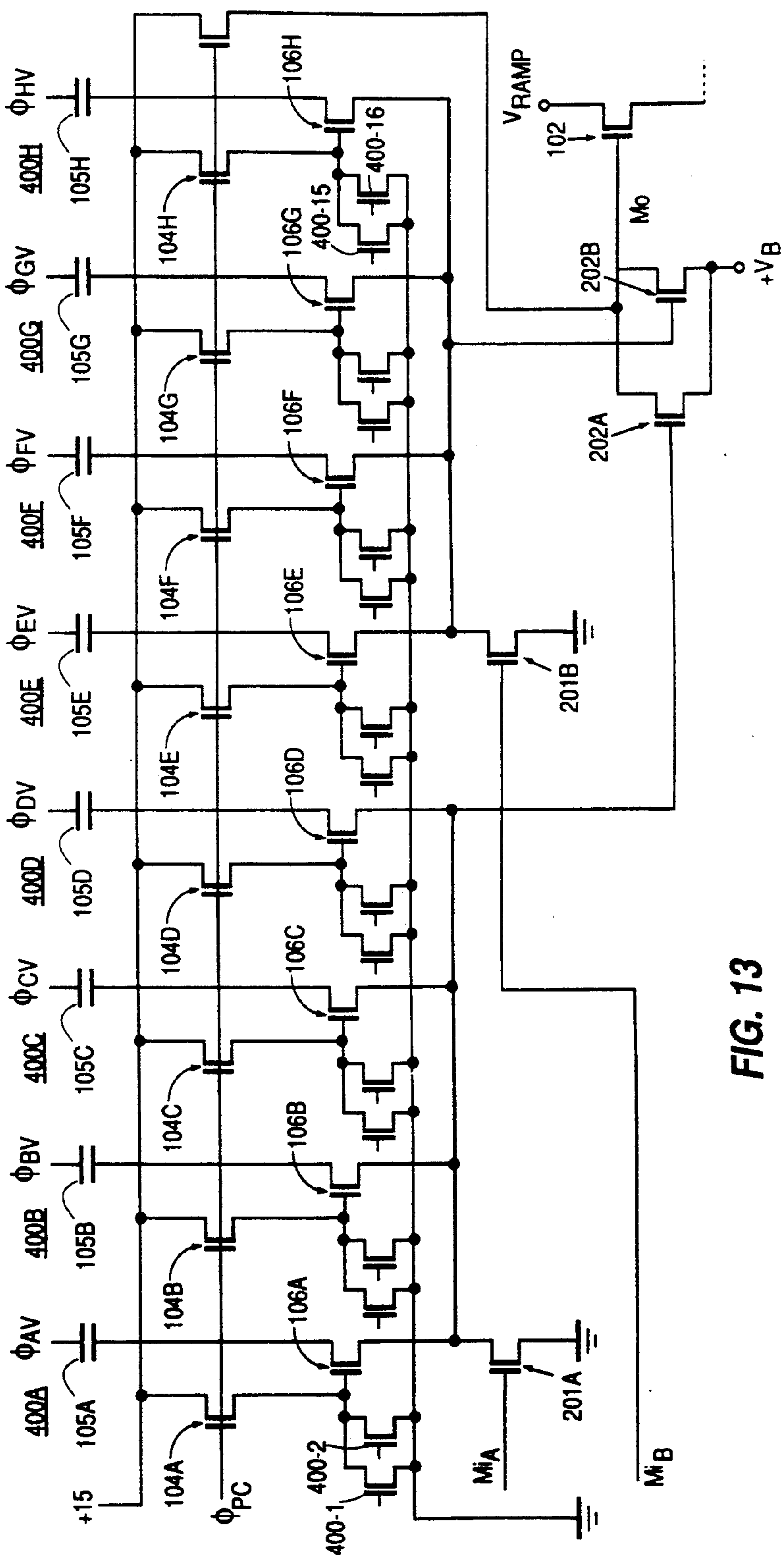
FIG. 13 is a schematic diagram of a two input embodiment of the time vernier circuit of FIG. 1 composed of eight differently-phased stages.

FIG. 13 is an embodiment of a vernier 400 which receives two arming pulses MiA and MiB from the comparator stage embodiment which supplies two Mo output pulses. The FIG. 13 embodiment operates with eight phases $\phi_{AV}$ to $\phi_{HV}$ supplied to eight stages 400A to 400H respectively. As indicated by like reference numbers, the other elements (capacitor 105, and TFT's 104 and 106 of each stage), and TFT's 201A, 201B, 202A and 202B of the vernier, are the same as those of the FIG. 9 embodiment. The two LSB's the vernier (D1V and D2V), and their compliments are applied to the 400 TFT's of the 400A to 400H stages as shown in FIG. 14. Accordingly, in the FIG. 13 embodiment each stage includes two 400 TFT's, the gates of both of which must be logic ZERO for a $\phi$ phase pulse to turn off TFT 102. The FIG. 13 embodiment therefore provides an output pulse Mo which can be any one of sixteen possible widths.

What is claimed is:

1. A time vernier circuit comprising:

P ordinally-arranged interconnected stages, where P is a plural integer, each stage including an input terminal for receiving one of a plurality of phase-shifted timing pulses, each stage also including a node-charging transistor in series with a load capacitance for forwarding charging current of one of said timing pulses applied to said load capacitance to a node by conduction of said node-charging transistor when said node-charging transistor is enabled, said node-charging transistor of each stage exhibiting significant distributed gate/source and gate/drain capacitances;

each of said stages including first means for applying a precharging pulse to the gate of said node-charging transistor of at least one stage prior to the application of one of said timing pulses to said load capacitance to enable said node-charging transistor by charging said distributed capacitances, whereby said node-charging transistor remains enabled when said distributed capacitances remain charged, said first means maintaining the node-charging transistor of each non-selected stage disabled; said first means including first data controlled means for applying data inputs to said stages, said data controlled means including at least one transistor for controlling said node charging transistor, second means for applying one of said timing pulses to the load capacitance of at least one of said interconnected stages, whereby the precharging of the gate of an enabled node-charging transistor decreases its response time to the applied timing pulse and thereby increases the maximum speed at which said time vernier circuit may be operated, despite the significant respective distributed capacitances between the gate/source and between the gate/-drain of said node-charging transistor; and third means for applying at least one arming pulse to said stages for arming said stages prior to the application said timing pulses to said stages.

2. The circuit of claim 1, wherein said source of said node-charging transistor of each of said P stages is connected to a common node that interconnects said P stages, and said load capacitance of each of said P stages is serially connected to said drain of said node-charging transistor;

said timing pulses occur at a plurality of different phases equal to P and occur successively in a given order, and said second means applies timing pulses that occur at each separate ordinal one of said P different phases to the drain of said node-charging transistor through said serially-connected load capacitance of that one of said ordinally-arranged P stages that corresponds in ordinal position thereto;

said first means further including at least a second data-controlled means in parallel with said first data-controlled means whereby the output pulse of said pulse logic circuit can have any one of at least 2P widths in accordance with said data inputs.

3. The circuit of claim 2 further including a pull-down transistor responsive to said node for controlling the output pulse width of said vernier circuit in response to voltage changes on said node.

4. The circuit of claim 3 wherein there are two of said third means for applying and two of said nodes, for applying two arming pulses to selected stages, one of said arming pulses arming one set of P/2 stages and the other arming pulses arming the other set of P/2 stages.

5. The circuit of claim 4 wherein there are two of said pull-down transistors individually responsive to said two nodes.

6. The circuit of claim 2 wherein there are three of said data-controlled means arranged in parallel.

7. The circuit of claim 6 wherein there are two of said third means for applying and two of said nodes, for applying two arming pulses to selected stages, one of said arming pulses arming one set of P/2 stages and the other arming pulses arming the other set of P/2 stages.

8. The circuit of claim 7 wherein there are two of said pull-down transistors individually responsive to said two nodes.

9. A variable pulse width generator for controlling the on-off state of solid state switching devices, said solid state switching devices, when turned on, applying a ramp voltage to the display elements of a display device, said variable width generator comprising:

a plurality of cascaded comparator circuits for providing a comparator output signal having a variable width in accordance with the most significant bits of an n bit signal, said comparator circuits being sequentially actuated by a plurality of phase-shifted timing pulses;

a vernier circuit responsive to said comparator output signal for further changing the width of said output signal in accordance with at least one of the two least significant bits of said n bit signal.

10. The pulse width generator of claim 9 wherein said time vernier circuit comprises:

P ordinally-arranged interconnected stages, where P is a plural integer, each stage including an input terminal for receiving one of a plurality of phase-shifted timing pulses, each stage also including a node-charging transistor for forwarding charging current of one of said timing pulses applied to a node by conduction of said node-charging transistor when said node-charging transistor is enabled, said node-charging transistor of each stage exhibiting significant distributed gate/source and gate/-drain capacitances;

each of said stages including first means for applying a precharging pulse to the gate of said node-charging transistor of at least one stage prior to the application of one of said timing pulses to said node-charging transistor by charging said distributed capacitances, whereby said node-charging transistor remains enabled when said distributed capacitances remain charged, said first means maintaining the node-charging transistor of each non-selected stage disabled; said first means including first data controlled means for applying data inputs to said stages, said data controlled means including at least one transistor for controlling said node charging transistor, second means for applying one of said timing pulses to the load of one of said interconnected stages, whereby the precharging of the gate of an enabled node-charging transistor decreases its response time to an applied timing pulse and thereby increases the maximum speed at which said variable pulse width generator may be operated, despite the significant respective distributed capacitances between the gate/source and between the gate/drain of said node-charging transistor; and third means for applying at least one arming pulse to said stages for arming said stages prior to the application said timing pulses to said stages.

11. The circuit of claim 10 wherein said source of said node-charging transistor of each of said P stages is connected to a common node that interconnects said P stages, and said load capacitance of each of said P stages is serially connected to said drain of said node-charging transistor;

said timing pulses occur at a plurality of different phases equal to P and occur successively in a given order, and said second means applies timing pulses that occur at each separate ordinal one of said P different phases to the drain of said node-charging transistor through said serially-connected load capacitance of that one of said ordinally-arranged P stages that corresponds in ordinal position thereto;

said first means further including at least a second data-controlled means in parallel with said first data-controlled means whereby the output pulse of said pulse logic circuit can have any one of at least 2P widths in accordance with said data inputs.

12. The circuit of claim 11 further including a pull-down transistor responsive to said node for controlling the output pulse width of said vernier circuit in response to voltage changes on said node.

13. The circuit of claim 12 wherein there are two of said third means for applying and two of said nodes, for applying two arming pulses to selected stages, one of said arming pulses arming one set of P/2 stages and the other arming pulses arming the other set of P/2 stages.

14. The circuit of claim 13 wherein there are two of said pull-down transistors individually responsive to said two nodes.

15. The circuit of claim 11 wherein there are three of said data-controlled means arranged in parallel.

16. The circuit of claim 15 wherein there are two of said third means for applying and two of said nodes, for applying two arming pulses to selected stages, one of said arming pulses arming one set of P/2 stages and the other arming pulses arming the other set of P/2 stages.

17. The circuit of claim 16 wherein there are two of said pull-down transistors individually responsive to said two nodes.

* * * * *